United States Patent
Alben et al.

(10) Patent No.: US 8,786,345 B2
(45) Date of Patent: *Jul. 22, 2014

(54) SINGLE-TRIGGER LOW-ENERGY FLIP-FLOP CIRCUIT

(71) Applicant: NVIDIA Corporation, Santa Clara, CA (US)

(72) Inventors: Jonah M. Alben, San Jose, CA (US); William J. Dally, Los Altos Hills, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/852,987

(22) Filed: Mar. 28, 2013

(65) Prior Publication Data
US 2013/0214839 A1    Aug. 22, 2013

Related U.S. Application Data

(63) Continuation of application No. 13/095,641, filed on Apr. 27, 2011, now Pat. No. 8,436,669.

(51) Int. Cl.
*H03K 3/00*    (2006.01)
(52) U.S. Cl.
USPC ........... 327/218; 327/208; 327/211; 327/212; 327/219; 327/225; 326/95; 326/98
(58) Field of Classification Search
USPC ......... 327/199–201, 208–215, 217–219, 223, 327/225; 326/93–98
See application file for complete search history.

(56) References Cited

U.S. PATENT DOCUMENTS

| | | | | |
|---|---|---|---|---|
| 5,498,988 A * | 3/1996 | Reyes et al. | | 327/199 |
| 6,822,478 B2 * | 11/2004 | Elappuparackal | | 326/46 |
| 7,265,596 B2 * | 9/2007 | Kang et al. | | 327/161 |
| 7,405,606 B2 * | 7/2008 | Kok et al. | | 327/202 |
| 7,420,391 B2 * | 9/2008 | Pesci | | 326/46 |
| 7,772,905 B2 * | 8/2010 | Yasuda et al. | | 327/202 |
| 7,782,108 B2 * | 8/2010 | Sedlak | | 327/211 |
| 7,872,514 B2 * | 1/2011 | Chee | | 327/218 |
| 8,436,669 B2 * | 5/2013 | Alben et al. | | 327/218 |
| 2006/0221723 A1 | 10/2006 | Kang | | |
| 2007/0024337 A1 | 2/2007 | Teh | | |
| 2007/0229133 A1 | 10/2007 | Tam et al. | | |
| 2012/0182056 A1 * | 7/2012 | Dally et al. | | 327/202 |

OTHER PUBLICATIONS

Uyemura, John P. Introduction to VLSI Circuits and Systems. New York: J. Wiley, 2002; p. 279.*

(Continued)

*Primary Examiner* — Patrick O'Neill
(74) *Attorney, Agent, or Firm* — Zilka-Kotab, PC (57) ABSTRACT

One embodiment of the present invention sets forth a technique for capturing and storing a level of an input signal using a single-trigger low-energy flip-flop circuit that is fully-static and insensitive to fabrication process variations, The single-trigger low-energy flip-flop circuit presents only three transistor gate loads to the clock signal and none of the internal nodes toggle when the input signal remains constant, The output signal Q is set or reset at the rising clock edge using a single- trigger sub-circuit. A set or reset may be armed while the clock signal is low, and the set or reset is triggered at the rising edge of the clock.

17 Claims, 6 Drawing Sheets

(56) References Cited

OTHER PUBLICATIONS

Extended European Search Report from European Patent Application No. 12165817.3 dated May 10, 2013.

Notice of Preliminary Rejection from Korean Patent Application No. 10-2012-0044965, dated Apr. 29, 2013.
Notice of Preliminary Rejection from Korean Patent Application No. 10-2012-0044965, dated Nov. 14, 2013.

* cited by examiner

SINGLE-TRIGGER LOW-ENERGY FLIP-FLOP CIRCUIT

RELATED APPLICATION(S)

The present application is a continuation of U.S. application Ser. No. 13/095,641, filed Apr. 27, 2011, which is incorporated herein by reference in its entirety.

BACKGROUND OF THE INVENTION

1. Field of the Invention

The present invention generally relates to digital flip-flop circuits and more specifically to a single-trigger low-energy flip-flop circuit that is fully-static and insensitive to fabrication process variations.

2. Description of the Related Art

Power dissipation is a significant problem in conventional integrated circuits. A large fraction of the power dissipated in conventional digital integrated circuits is consumed in the clock network. The amount of energy that is consumed by flip-flops due to data transitions is small because the activity factor, the fraction of time the data input of the flip-flop toggles, is quite low, typically about 5-10%. In contrast, the clock input load and clock energy is an increasingly important metric to consider when determining the energy that is consumed by the latches and flip-flops in a conventional integrated circuit. Reducing the clock-switched capacitance by a given amount produces 10× the power savings compared with reducing the data-switched capacitance by the same amount.

Figure 1:
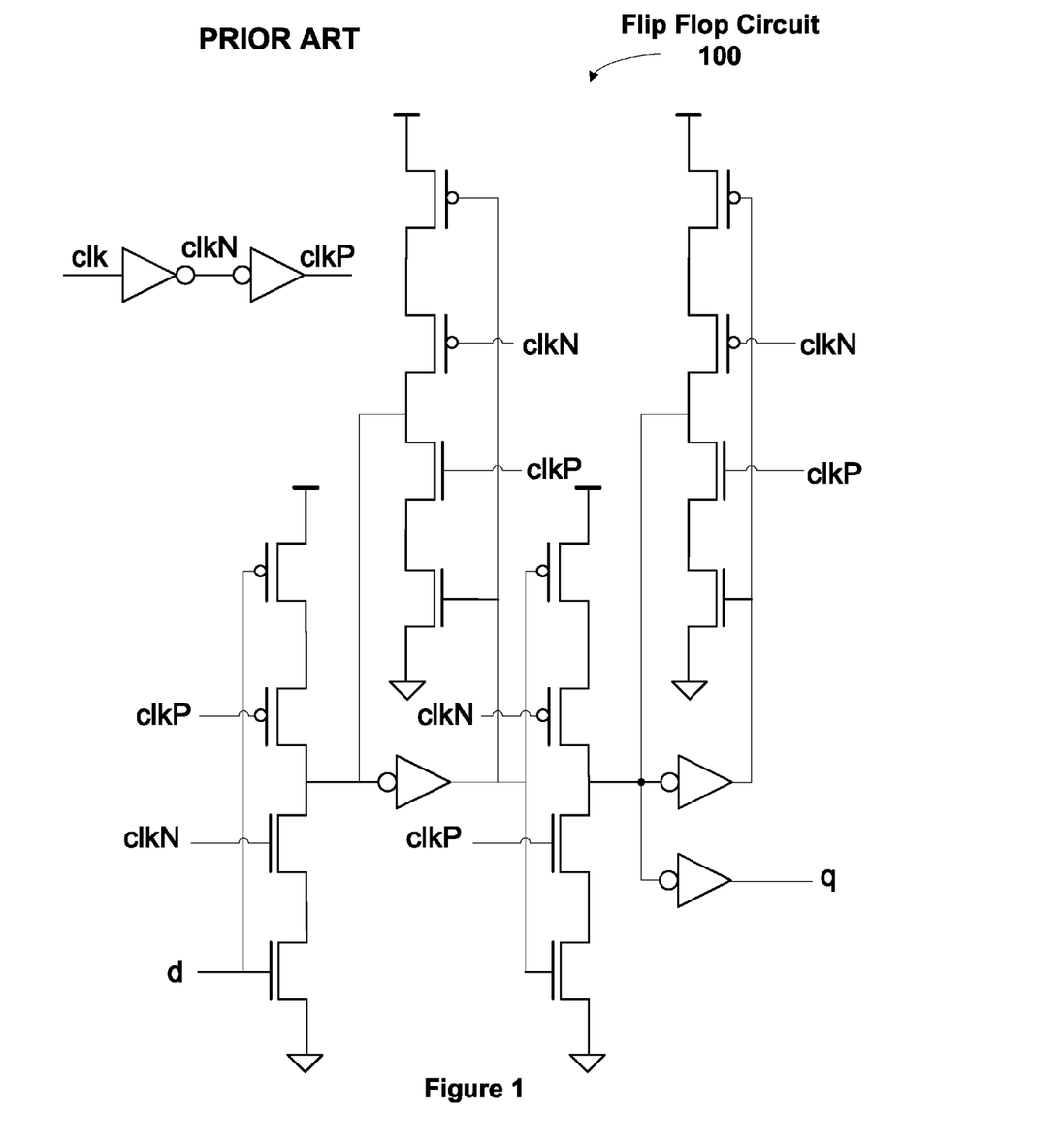
FIG. 1 illustrates a conventional flip-flop circuit, according to the prior art.

FIG. 1 illustrates a conventional flip-flop circuit 100. The flip-flop circuit 100 includes 26 transistors, including the inverters used to generate clkN and clkP. Each of the clock signals, clkP has a load of four transistor devices and clkN ha a load of six transistor devices. At each clock transition, 12 transistor gates (and corresponding wires) toggle, including the gates coupled to the clk signal.

Figure 2:
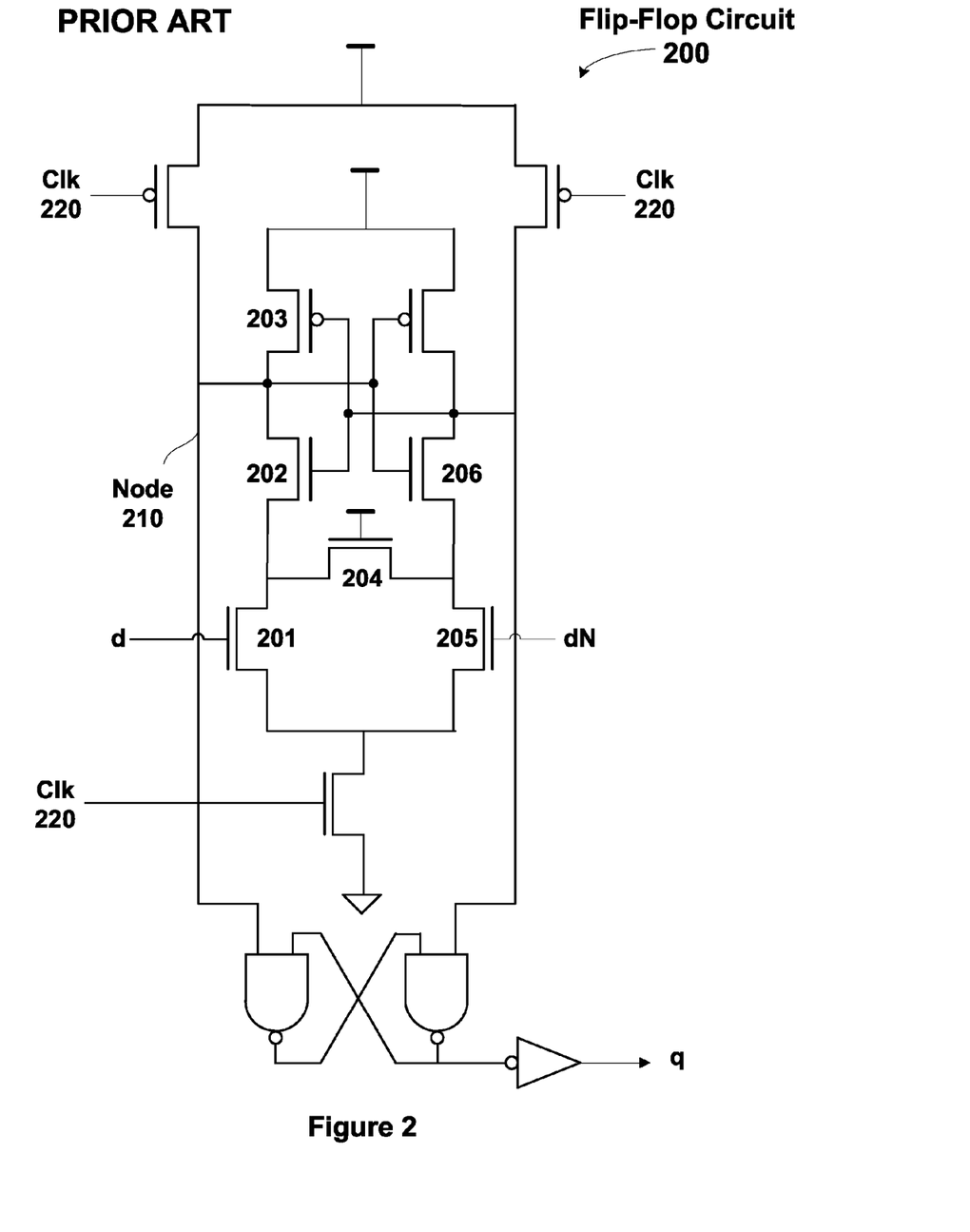
FIG. 2 illustrates another conventional flip-flop circuit, according to the prior art.

FIG. 2 illustrates another conventional flip-flop circuit 200 that is sometimes referred to as the StrongARM flip-flop. Compared with the flip-flop circuit 100, the total clock load presented to Clk 220 of the flip-flop circuit 200 is only three transistor devices. The total number of transistors in the flip-flop circuit 200 is twenty, where each NAND gate includes four transistors. However, half of the internal nodes toggle each clock cycle. The internal nodes include the gates that are coupled to Clk 220 and the node 210. The node 210 is coupled to four transistor gates and three transistor sources or drains. The total number of internal nodes that toggle each clock cycle is seven gates and ten transistor sources or drains or the equivalent of approximately seventeen gate loads. Suppose input d is high and all of the internal nodes are initially high (Vdd or a Vt drop below Vdd). When the Clk 220 goes high both source and drain of input transistor 201 go low, both source and drain of the transistor 202 go low, the drain of transistor 203 goes low, both sides of bridging transistor 204 go low, both the source and drain of input transistor 205 go low, and the source of transistor 206 goes low.

Accordingly, what is needed in the art is a flip-flop circuit that reduces the energy consumed by reducing the number of internal nodes that toggle during a clock cycle. Additionally, the flip-flop circuit should function independent of fabrication process variations by not relying on sizing relationships between different transistors in the flip-flop circuit,

SUMMARY OF THE INVENTION

One embodiment of the present invention sets forth a technique for capturing and storing a level of an input signal using a single-trigger, low-energy flip-flop circuit that is fully-static and insensitive to fabrication process variations. The single-trigger, low-energy flip-flop circuit presents only three transistor gate loads to the clock signal and none of the internal nodes toggle when the input signal remains constant. One of the clock signals may be a low-frequency "keeper clock" that toggles less frequently than the other two clock signals that are input to two transistor gates.

Various embodiments of the invention comprise a single-trigger low-energy flip-flop circuit including a trigger sub-circuit and a latch sub-circuit. The trigger sub-circuit includes a first clock-activated transistor and is configured to arm a trigger signal when an input signal to the single-trigger low-energy flip-flop circuit is at a different level than a level of an output signal generated by the single-trigger low-energy flip-flop circuit. The latch sub-circuit includes a second clock-activated transistor and is configured to change the level of the output signal when the trigger signal is armed and a clock signal transitions from a first level to a second level and maintain the level of the output signal when the trigger signal is unarmed.

One advantage of the disclosed single-trigger low-energy flip-flop circuit is that the transistor device load on the clock signal is reduced to only three transistor gates. Therefore, the clock energy is reduced significantly compared with flip-flop circuits having greater loads on the clock signal. Additionally, the internal nodes are driven high or low during stable states of the circuit to produce a fully static design that does not rely on sizing relationships between the different transistors, such as transistors configured as sense amplifiers. Therefore, the single-trigger low-energy flip-flop circuit operation is robust, even when the characteristics of the transistors vary due to the fabrication process.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 3:
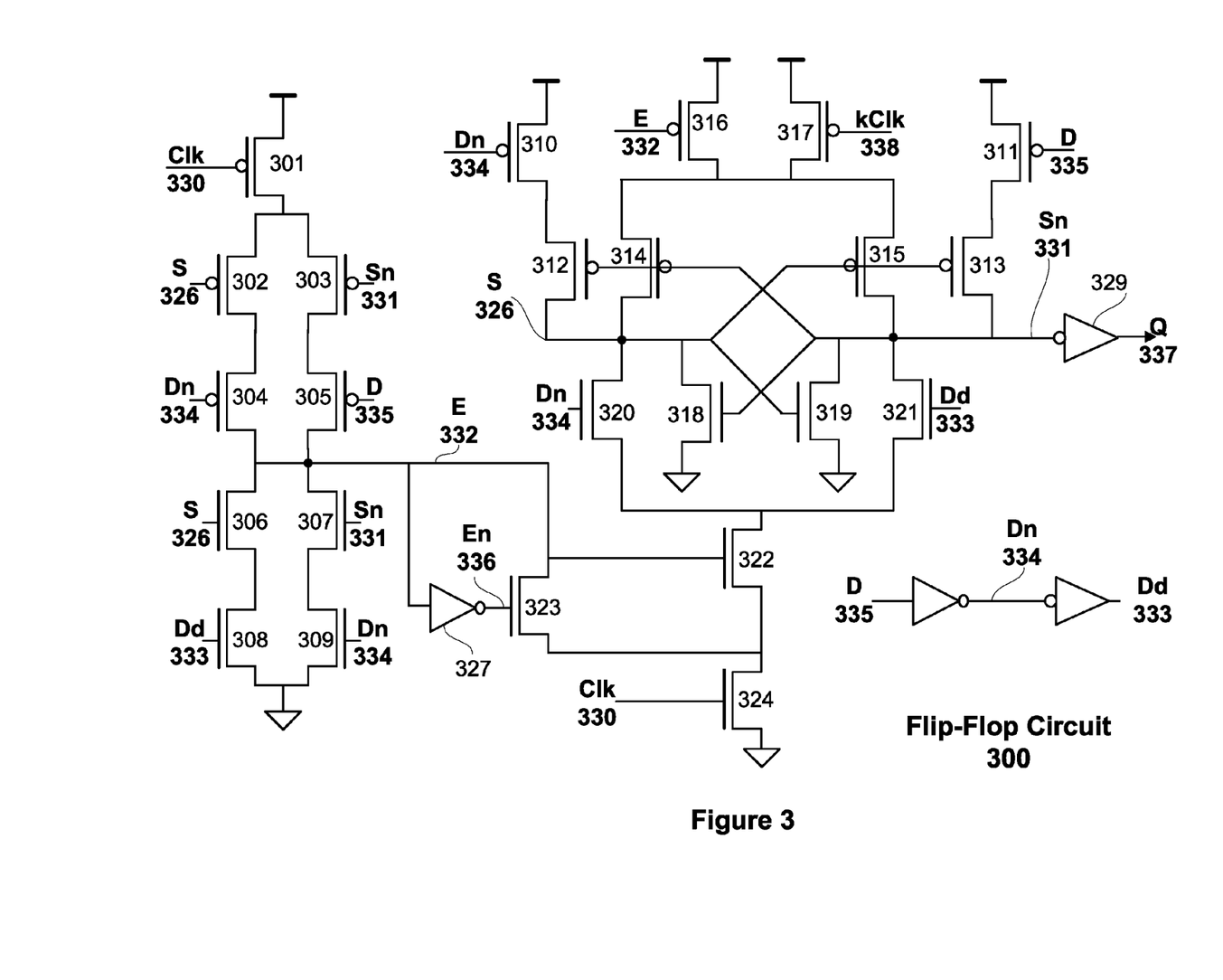
FIG. 3 illustrates a single-trigger low-energy flip-flop circuit, according to one embodiment of the invention.

FIG. 3 illustrates a single-trigger low-energy flip-flop circuit 300, according to one embodiment of the invention. The flip-flop circuit 300 is a fully-static, clock-energy efficient flip-flop that presents only three loads to the clock and does not depend on transistor device size relationships. As shown in FIG. 3 transistors 306, 307, 308, 309, 318, 319, 320, 321, 322, 323, and 324 are NMOS devices and transistors 301, 302, 303, 304, 305, 310, 311, 312, 313, 314, 315, 316, and 317 are PMOS devices. The flip-flop circuit 300 includes four main sub-circuits, a single trigger sub-circuit, an output buffer, and a latch. Transistors 301, 302, 303, 304, 305, 306, 307, 308, 309, 323, and inverter 327 are configured to form the single trigger sub-circuit.

When the input signal Dd 333 changes to a level that is different than the level of the output Q 337 when the Clk 330 is low, the single trigger circuit is "armed," i.e., configured to set or reset the output Q 337 at the next rising edge of the Clk 330. If Dd 333 changes value again, so that Dd 333 is the same level as Q 337 while the Clk 330 is still low, the armed trigger circuit is unarmed.

The single trigger sub-circuit asserts the trigger signal, pulling E 332 up to a high level, when the input signal Dd 333 is low and Q 337 is high and the Clk 330 is low. A reset is triggered to force the output signal Q 337 to a low level when the Clk 330 transitions from low to high. The single trigger sub-circuit also asserts the trigger signal, pulling E 332 up to a high level, when the input signal Dd 333 is high and Q 337 is low and the clock is low. A set is triggered to force the output signal Q 337 to a high level when the clock 330 transitions from low to high. When the input signal Dd 333 and the output signal Q 337 are at the same level, E 332 is low and En 336 is high.

Transistors 310, 311, 312, 313, 314, 315, 316, 317, 318, 319, 320, 321, 322, and 324 are configured to form the latch circuit. Inverter 329 is configured to buffer the output of the latch and generate the flip-flop output Q 337. In contrast with the trigger sub circuit that is enabled when the clk 330 is low, the latch circuit is enabled when the Clk 330 is high and transistor 324 is enabled. When E 332 is low and the clock transitions from low to high, transistor 322 is disabled so that neither S 326 nor Sn 331 are changed. The inverter 327 and transistor 323 function as a keeper circuit to maintain E 332 low if any of the inputs (Dd 333, Dn 334, D 335, S 326, Sn 331) change while the Clk 330 is high. When E 332 is low, transistor 316 is enabled so that the latch maintains the level of output Q 337.

When E 332 is high (trigger is armed) and the clock transitions from low to high, transistor 322 is enabled and either S 326 or Sn 331 is pulled down so that output Q 337 changes to the same level as input Dd 333, I.e., so that Dd 333 is passed through to the output Q 337. When E 332 and the kClk 338 are high, transistors 316 and 317 are disabled so that the latch passes the level of Dd 333 through to the output Q 337. Once S 326 reaches the same level as Dd 333 or Sn 331 reaches the same level as Dn 334, the trigger signal E 322 is disarmed, i.e., pulled low by the single trigger sub-circuit. Transistors 310 and 312 are configured to pull-up E 326 when On 334 and Sn 331 are both low, causing Q 337 to transition high. Transistors 311 and 313 are configured pull-up Sn 331 when Dd 333 and E 326 are both low, causing Q 337 to transition. Transistor 316 serves as a keeper after E 332 transitions low and until the Clk 330 transitions low. The 335 input may change after transistor 316 is activated to keep the state of S 326 and Sn 331.

In sum, if the single trigger sub-circuit is armed when the Clk 330 rises, a state transition is triggered. In particular, if Dd 333 is asserted when Clk 330 rises, the latch sub-circuit is set by pulling node sN 331 low via clock-enabled pull-down transistor 324 and transistor 322. When the Clk 330 is high, the data input dN 334 should remain stable until the trigger signal, E 332 is deasserted (unarmed) to ensure that the hold time for the single-trigger low-energy flip-flop circuit 300 is met. Note that using Q 335 to activate transistors 305 and 311 reduces the length of the hold time requirement, i.e., provides additional margin for the hold time. Alternatively, the invertor between Dn 334 and Dd 333 may be omitted and D 335 may replace Dd 333. When E 332 is deasserted (unarmed), transistor 316 is enabled so that the levels of S 326, Sn 331, and output Q 337 are maintained. S 326, Sn 331, and output Q 337 will remain unchanged until the single-trigger sub-circuit is armed (E 332 is asserted) and Clk 330 rises.

The triggering of a set occurs when E 332 and Clk 330 are high and the node Sn 331 is pulled low through transistor 321, node S 326 is then pulled up by transistors 312 and 310. Since the state transition was triggered by Dd 333 being high and Q 337 being low, the signal On 334 is guaranteed to be low. Sn 331 going low forces Q 337 high, effectively setting Q 337. The triggering of a reset proceeds in a similar manner. If E 332 is armed when Clk 330 rises and Dd 333 is low, node s 326 is pulled down through transistors 320, 322, and 324, which in turn pulls up node sN 331. Sn 331 going high forces Q 337 low, effectively resetting Q 337. When the node s 326 goes low, sN 331 is pulled up by transistors 311 and 313. Since the state transition was triggered by Dd 333 being low and Q 337 being high, the transistor 311 is enabled.

The transistor 317 receives a keeper clock signal, kClk 338. It is not necessary to activate kclk 338 every clock cycle. It is sufficient for the keeper clock signal kclk to go low once every N cycles, where N is small enough so that charge is restored to the node shared by transistors 314, 315, 316, and 317. A value, N of 100, would suffice for most conditions and would result in the keeper clock bad consuming only 1% of the energy of a clock bad that toggled every cycle. The keeper clock signal kclk 338 should be gated high enough in the clock tree so that the clock bad of an OR gate used to generate the keeper clock signal kclk 338 can be amortized over many flip-flop circuits 300. The keeper clock signal kClk 338 may be generated using a clock gating circuit that is described in patent application Ser. No. 13/008,894 filed Jan. 18, 2011, and titled "Low Energy Flip-Flops."

Figure 4:
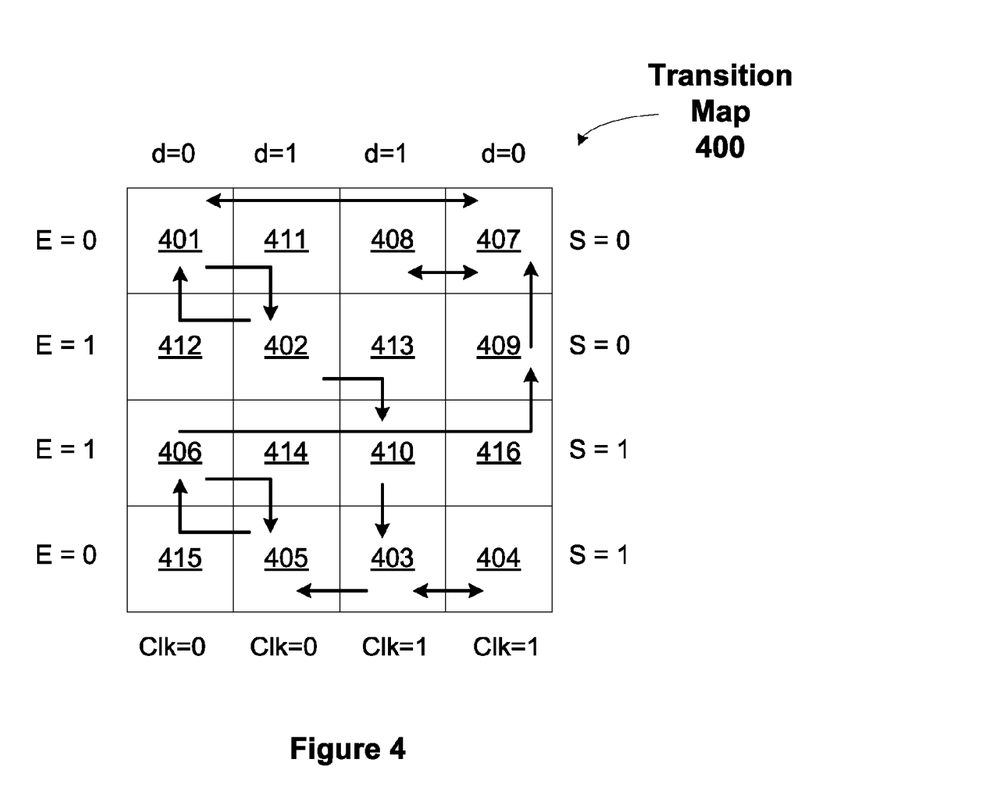
FIG. 4 is a transition map diagram showing legal transitions for the single-trigger low-energy flip-flop circuit for each combination of input signals, in accordance with one or more aspects of the present invention.

FIG. 4 is a transition map diagram 400 showing legal transitions for the single-trigger low-energy flip-flop circuit 300 for each combination of input signals, in accordance with one or more aspects of the present invention, The behavior of the single-trigger flip-flop circuit 300 may be understood by considering each of the flip-flop circuits to be an asynchronous finite state machine and following the state transitions on the transition map 400. The transition map 400 plots the states of the input variables (D 335 and Clk 330) on the horizontal axis and the state variables (E 332 and S 326) on the vertical axis. AD horizontal transitions are input stimulus. AD vertical transitions are the response of the flip-flop circuit 300 to the input stimulus.

The flip-flop circuit 300 has eight stable states labeled 401, 402, 403, 404, 405, 406, 407, and 408. There are six transient states labeled 411, 412, 413, 414, 415, and 416 that reflect the state of the circuit after an input change but before the circuit's response to that change.

Consider starting in state 401 with Clk=D=Q=0. As with all stable states, there are two possibilities, Clk 330 can change, or D 335 can change. (As with all flip-flops, the setup and hold time constraints guarantee the fundamental mode assumption for the flip-flop circuit 300.) If Clk 330 rises in state 401, the flip-flop circuit 300 transitions to state 407 with no response from the flip-flop circuit. If D 335 rises in state 401 the single-trigger flip-flop circuit 300 transitions to state 402 and the single-trigger sub-circuit asserts E 332, arming the trigger. In state 402, D 335 transitioning back to 0 will return the single-trigger flip-flop circuit 300 to state 401, negating E 332 and unarming the trigger. If D 335 toggles while Clk 330 is low, the flip-flop circuit 300 can cycle around the loop between states 401 and 402.

If the Clk 330 rises while the single-trigger flip-flop circuit 300 is in state 402, the single-trigger flip-flop circuit flip-flop circuit 300 responds by asserting S 326, thereby triggering the set. The single-trigger flip-flop circuit 300 transitions from state 402 to the transient state 410 and immediately transitions to state 403 as S 326 rising causes E 332 to be pulled-down by the single trigger sub-circuit. When the single-trigger flip-flop circuit 300 is in state 403 and Clk 330 falls, the single-trigger flip-flop circuit 300 transitions to state 405. State 405 is analogous to state 401, but with D=Q=1.

The reset sequence occurs when the single-trigger flip-flop circuit 300 transitions from state 405 when D=1 and Q=1 to state 406 when D 335 falls, arming the trigger. In state 406, D 335 transitioning back to 1 will return the single-trigger flip-flop circuit 300 to state 405, unarming the trigger. If D 335 toggles while Clk 330 is low, the single-trigger flip-flop circuit 300 can cycle around the loop between states 405 and 406. If Clk 330 rises while the single-trigger flip-flop circuit 300 is in state 406, the single-trigger flip-flop circuit 300 responds by negating S 326 (asserting Sn 331), thereby triggering a reset. The single-trigger flip-flop circuit 300 transitions from state 406 to the transient state 409 and immediately transitions to state 407 as S 326 falling causes E 332 to be pulled-down by the single trigger sub-circuit. When the single-trigger flip-flop circuit 300 is in state 407 and Clk 330 falls, the single-trigger flip-flop circuit 300 transitions to state 401.

When S=D=0, input changes cause transitions between states 401, 407, and 408 occur with no response in the single-trigger flip-flop circuit 300. Similarly, when S=D=1, input changes cause transitions between states 403, 404, and 405 occur with no response in the single-trigger flip-flop circuit 300. Only when Clk 330 is low and D≠S does the single-trigger flip-flop circuit 300 transition to the armed state 402 or 406. If the single-trigger flip-flop circuit 300 is in an armed state when Clk 330 rises, the appropriate trigger takes place—setting or resetting the single-trigger flip-flop circuit 300 by transitioning to state 403 via transient state 410 or state 407 via transient state 409, respectively.

An analysis of the single-trigger flip-flop circuit 300 shows that all major nodes (E 332, En 336, S 326, and Sn 331) are driven either high or low in each of the eight stable states 401, 402, 403, 404, 405, 406, 407, and 408. Thus, the single-trigger flip-flop circuit 300 is fully static. Node S 326 is undriven briefly during the transient state 413 (on the way to transient state 410). Similarly node sN 331 is undriven briefly during the transient state 416 (on the way to transient state 409). However, since these transient states 413 and 416 persist for only one or two gate delays, floating nodes in these states are not a concern. Also, if E 332 is high when the Clk 330 transitions from low to high, E 332 will be floating high, not driven high. E 332 is expected to remain high for a few gate delays until it is pulled low by transistors 306 and 308 or transistors 307 and 309. All nodes are driven in the transient states 411, 412, 413, and 415.

Figure 5:
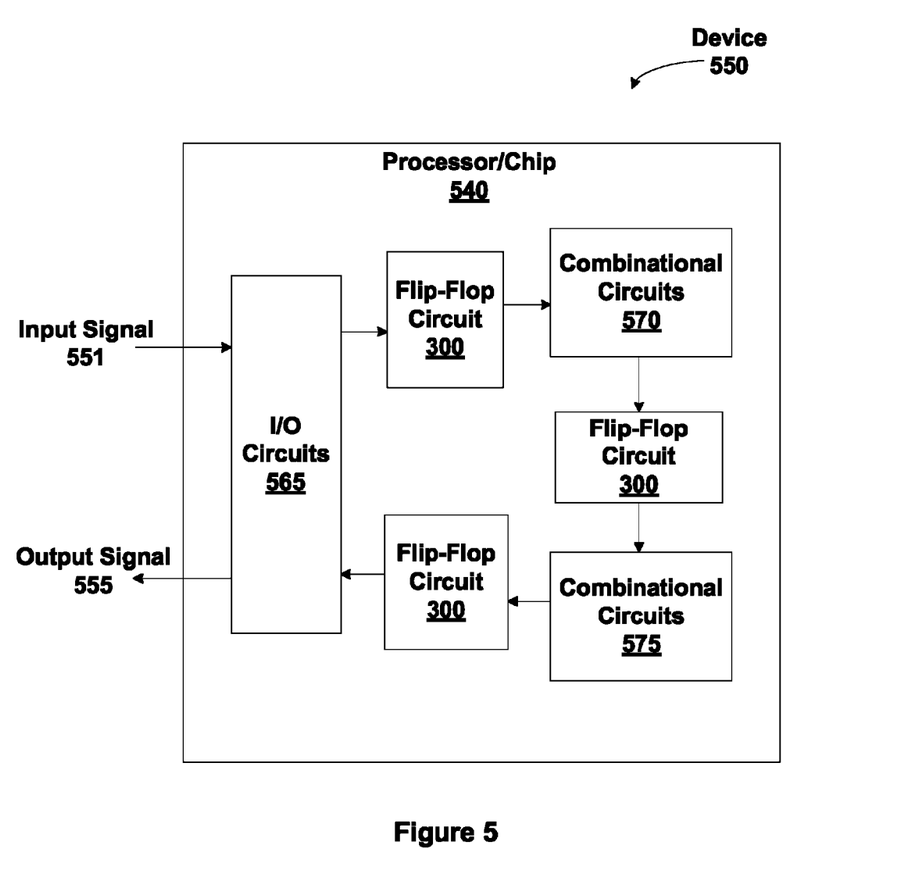
FIG. 5 is a block diagram illustrating a processor/chip including the single-trigger low-energy flip-flop circuit shown in FIG. 3, in accordance with one or more aspects of the present invention.

FIG. 5 is a block diagram illustrating a processor/chip 540 including single-trigger flip-flop circuit 300 from FIG. 3, in accordance with one or more aspects of the present invention. I/O circuits 565 may include pads and other I/O specific circuits to send and receive signals from other devices in a system. Output signal 555 is produced by I/O circuits 565 based on signals received by the I/O circuits 565. The input signal 551 is received by the I/O circuits 565 and is input to the first single-trigger flip-flop circuit 300 for storage. The I/O circuits 565 also provide clock signals to the single-trigger flip-flop circuit 300. The combinational circuits 570 receive the output generated by the first single-trigger flip-flop circuit 300 and generate a combinational output that is received by the second single-trigger flip-flop circuit 300. The second single-trigger flip-flop circuit 300 stores the combinational output and generates an output that is input to the combinational circuits 572. The output of the combinational circuits 572 is received and stored by the third single-trigger flip-flop circuit 300, The third single-trigger flip-flop circuit 300 generates an output that is provided to the I/O circuits 565. The single-trigger flip-flop circuit 300 may be used to store signals for multiple clock cycles or to pipeline signals that change as frequently as each clock cycle.

System Overview

Figure 6:
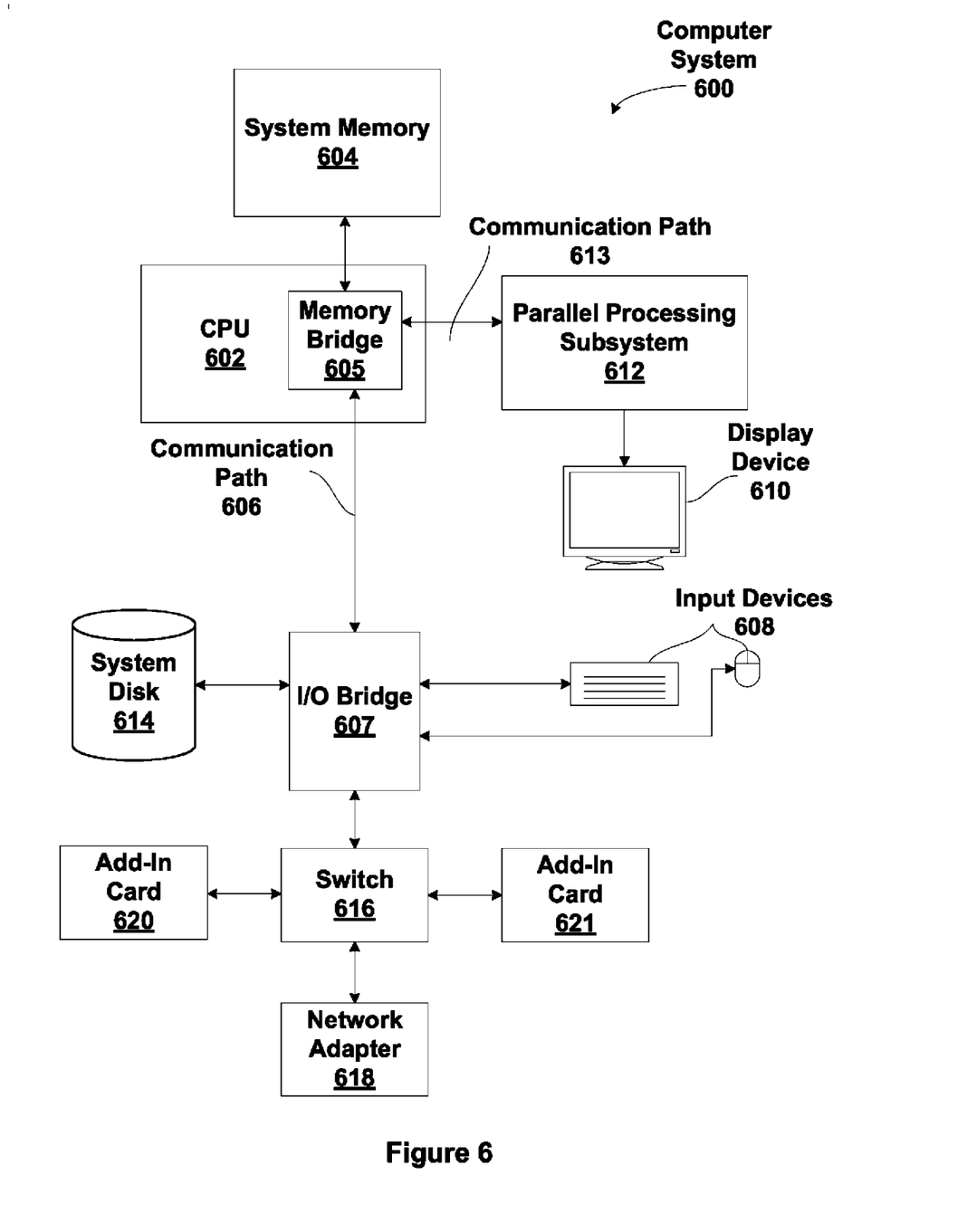
FIG. 6 is a block diagram illustrating a computer system configured to implement one or more aspects of the present invention.

FIG. 6 is a block diagram illustrating a computer system 100 configured to implement one or more aspects of the present invention. Computer system 600 includes a central processing unit (CPU) 602 and a system memory 604 communicating via a bus path through a memory bridge 605. Memory bridge 605 may be integrated into CPU 602 as shown in FIG. 6. Alternatively, memory bridge 605, may be a conventional device, e.g., a Northbridge chip, that is connected via a bus to CPU 602. Memory bridge 605 is connected via communication path 606 (e.g., a HyperTransport link) to an I/O (input/output) bridge 607. I/O bridge 607, which may be, e.g., a Southbridge chip, receives user input from one or more user input devices 608 (e.g., keyboard, mouse) and forwards the input to CPU 602 via path 606 and memory bridge 605. A parallel processing subsystem 612 is coupled to memory bridge 605 via a bus or other communication path 613 (e.g., a PCI Express, Accelerated Graphics Port, or HyperTransport link); in one embodiment parallel processing subsystem 612 is a graphics subsystem that delivers pixels to a display device 610 (e.g., a conventional CRT or LCD based monitor). A system disk 614 is also connected to I/O bridge 607. A switch 616 provides connections between I/O bridge 607 and other components such as a network adapter 618 and various add-in cards 620 and 621. Other components (not explicitly shown), including USB or other port connections, CD drives, DVD drives, film recording devices, and the like, may also be connected to I/O bridge 607. Communication paths interconnecting the various components in FIG. 6 may be implemented using any suitable protocols, such as PCI (Peripheral Component Interconnect), PCI-Express (PCI-E), AGP (Accelerated Graphics Port), HyperTransport, or any other bus or point-to-point communication protocol(s), and connections between different devices may use different protocols as is known in the art.

In one embodiment, the parallel processing subsystem 612 incorporates circuitry optimized for graphics and video processing, including, for example, video output circuitry, and constitutes a graphics processing unit (GPU). In another embodiment, the parallel processing subsystem 612 incorporates circuitry optimized for general purpose processing, while preserving the underlying computational architecture, described in greater detail herein. In yet another embodiment, the parallel processing subsystem 612 may be integrated with one or more other system elements, such as the memory bridge 605, CPU 602, and I/O bridge 607 to from a system on chip (SoC). One or more of CPU 602, parallel processing sub-system 612, I/O bridge 607, and switch 616 may include a single-trigger low-energy flip-flop circuit 300 or 350.

It will be appreciated that the system shown herein is illustrative and that variations and modifications are possible. The connection topology, including the number and arrangement of bridges, may be modified as desired. For instance, in some embodiments, system memory 604 is connected to CPU 602 directly rather than through a bridge, and other devices communicate with system memory 604 via memory bridge 605 and CPU 602. In other alternative topologies, parallel processing subsystem 612 is connected to I/O bridge 607 or directly to CPU 602, rather than to memory bridge 605. In still other embodiments, one or more of CPU 602, I/O bridge 607, parallel processing subsystem 612, and memory bridge 605 may be integrated into one or more chips. The particular components shown herein are optional; for instance, any number of add-in cards or peripheral devices might be supported. In some embodiments, switch 616 is eliminated, and network adapter 618 and add-in cards 620, 621 connect directly to I/O bridge 607.

In sum, the single-trigger low-energy flip-flop circuit 300 is fully static since all nodes are driven high or low during all stable states of the circuits. The single-trigger low-energy flip-flop circuit 300 is low energy since the internal nodes toggle only when the data changes and the loading of the clock is only three transistor gates. Additionally, the single-trigger low-energy flip-flop circuit 300 does not rely on sizing relationships between the different transistors to function properly. Therefore, the operation of single-trigger low-energy flip-flop circuit 300 is robust, even when the characteristics of the transistors vary due to the fabrication process.

One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored, The invention has been described above with reference to specific embodiments. Persons skilled in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

The invention claimed is:

1. A single-trigger low-energy flip-flop circuit, comprising:

a trigger sub-circuit that includes a first clock-activated transistor that is directly coupled to power and is configured to arm a trigger signal when an input signal to the single-trigger low-energy flip-flop circuit is at a different level than a level of an output signal generated by the single-trigger low-energy flip-flop circuit, wherein the trigger sub-circuit comprises transistors configured to function as an exclusive-or gate with the input signal and the output signal as inputs and the trigger signal as an output; and a latch sub-circuit that includes a second clock-activated transistor and is configured to change the level of the output signal when the trigger signal is armed and a clock signal transitions from a first level to a second level and maintain the level of the output signal when the trigger signal is unarmed, wherein a gate of the first clock-activated transistor and a gate of the second clock-activated transistor are directly coupled to the clock signal.

2. The single-trigger low-energy flip-flop circuit of claim 1, wherein the latch sub-circuit further comprises a third clock-activated transistor that is configured as a pull-up transistor.

3. The single-trigger low-energy flip-flop circuit of claim 2, wherein the third clock-activated transistor is enabled for every Nth clock cycle and N is greater than ten.

4. The single-trigger low-energy flip-flop circuit of claim 1, wherein the trigger sub-circuit is configured to disarm the trigger signal when the output signal changes to be at the same level as the input signal and the clock signal is at the second level.

5. The single-trigger low-energy flip-flop circuit of claim 1, wherein the trigger sub-circuit comprises an inverter and a transistor configured to function as a keeper circuit to maintain the trigger signal as unarmed if the input signal changes while the clock is at the second level.

6. The single-trigger low-energy flip-flop circuit of claim 1, wherein the first clock-enabled transistor is configured as a pull-up transistor to enable the trigger sub-circuit when the clock is at the first level.

7. The single-trigger low-energy flip-flop circuit of claim 1, further comprising an output inverter that is configured to isolate the output signal from a storage feedback loop within the latch sub-circuit.

8. The single-trigger low-energy flip-flop circuit of claim 1, wherein a third clock-activated transistor is configured as a pull-up transistor to enable the latch sub-circuit when the clock signal is at the first level.

9. The single-trigger low-energy flip-flop circuit of claim 1, wherein the second clock-activated transistor is configured as a pull-down transistor to enable the latch sub-circuit when the clock signal is at the second level.

10. The single-trigger low-energy flip-flop circuit of claim 1, wherein the latch sub-circuit comprises transistors coupled in series between the power and a node and configured to pull-up the node, causing the output signal to remain unchanged when the input signal and the output signal are at the same level.

11. The single-trigger low-energy flip-flop circuit of claim 1, wherein operation of the trigger sub-circuit and the latch sub-circuit does not depend on sizing relationships between transistors.

12. The single-trigger low-energy flip-flop circuit of claim 1, wherein the trigger sub-circuit receives a feedback signal that is generated by the latch sub-circuit and configured to disarm the trigger signal.

13. The single-trigger low-energy flip-flop circuit of claim 1, wherein the latch sub-circuit comprises a first inverter and a second inverter, and an output of the first inverter is coupled to an input of the second inverter and an output of the second inverter is coupled to an input of the first inverter.

14. The single-trigger low-energy flip-flop circuit of claim 13, wherein the first inverter and the second inverter form a storage sub-circuit of the latch sub-circuit.

15. The single-trigger low-energy flip-flop circuit of claim 1, wherein only three transistor gate loads are presented to the clock signal.

16. A single-trigger low-energy flip-flop circuit, comprising:
- a trigger sub-circuit that includes a first dock-activated transistor and is configured to arm a trigger signal when an input signal to the single-trigger low-energy flip-flop circuit is at a different level than a level of an output signal generated by the single-trigger low-energy flip-flop circuit, wherein the trigger sub-circuit comprises transistors configured to function as an exclusive-or gate with the input signal and the output signal as inputs and the trigger signal as an output; and
- a latch sub-circuit that includes a second clock-activated transistor that is directly coupled to ground and is configured to change the level of the output signal when the trigger signal is armed and a clock signal transitions from a first level to a second level and maintain the level of the output signal when the trigger signal is unarmed.

17. The single-trigger low-energy flip-flop circuit of claim 16,
- wherein a gate of the first clock-activated transistor and a gate of the second clock-activated transistor are directly coupled to the clock signal.

* * * * *